United States Patent
Xie et al.

(10) Patent No.: US 10,599,355 B2
(45) Date of Patent: Mar. 24, 2020

(54) DATA COMPRESSION WITH REDUNDANCY REMOVAL ACROSS BOUNDARIES OF COMPRESSION SEARCH ENGINES

(71) Applicant: Seagate Technology LLC, Cupertino, CA (US)

(72) Inventors: Hongmei Xie, Milpitas, CA (US); AbdelHakim S. Alhussien, San Jose, CA (US); Alex Ga Hing Tang, Cupertino, CA (US); Sundararajan Sankaranarayanan, Fremont, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 90 days.

(21) Appl. No.: 15/593,439

(22) Filed: May 12, 2017

(65) Prior Publication Data

US 2018/0329642 A1    Nov. 15, 2018

(51) Int. Cl.
    *G06F 3/06*      (2006.01)
    *H03M 7/30*      (2006.01)

(52) U.S. Cl.
    CPC .......... *G06F 3/0641* (2013.01); *G06F 3/0608* (2013.01); *G06F 3/0679* (2013.01);
(Continued)

(58) Field of Classification Search
    CPC .. G06F 3/0641; G06F 16/1748; G06F 3/0608; G06F 3/0679; H03M 7/30;
(Continued)

(56) References Cited

U.S. PATENT DOCUMENTS

| 5,864,859 A * | 1/1999 | Franaszek | G06F 12/08 |
| 9,400,610 B1 * | 7/2016 | Wallace | G06F 3/0652 |

(Continued)

OTHER PUBLICATIONS

Ziv et al., "A Universal Algorithm for Sequential Data Compression," IEEE Transactions on Information Theory, vol. IT-23, No. 3, May 1977.

*Primary Examiner* — Tuan V Thai
*Assistant Examiner* — Edward Waddy, Jr.
(74) *Attorney, Agent, or Firm* — Taylor English Duma LLP (57) ABSTRACT

Data compression techniques are provided that remove redundancy across the boundary of compression search engines. An illustrative method comprises splitting the data frame into a plurality of sub-chunks; comparing at least two of the plurality of sub-chunks to one another to remove at least one sub-chunk from the plurality of sub-chunks that substantially matches at least one other sub-chunk to generate a remaining plurality of sub-chunks; generating matching sub-chunk information for data reconstruction identifying the at least one removed sub-chunk and the corresponding substantially matched at least one other sub-chunk; grouping the remaining plurality of sub-chunks into sub-units; removing substantially repeated patterns within the sub-units to generate corresponding compressed sub-units; and combining the compressed sub-units with the matching sub-chunk information to generate a compressed data frame. The data frame optionally comprises one or more host pages compressed substantially simultaneously, and the compressed data frame for a plurality of host pages compressed substantially simultaneously comprises a host page address for each host page.

20 Claims, 9 Drawing Sheets

(52) U.S. Cl.
CPC ........... *H03M 7/30* (2013.01); *H03M 7/3091* (2013.01); *H03M 7/6088* (2013.01)

(58) Field of Classification Search
CPC ..... H03M 7/3091; H03M 7/6088; G06T 9/00; G10L 19/00; G10L 21/04; H04L 29/0604; H04N 19/00
USPC ................................................. 711/103, 154
See application file for complete search history.

(56) References Cited

U.S. PATENT DOCUMENTS

| | | | |
|---|---|---|---|
| 9,514,146 B1* | 12/2016 | Wallace | G06F 16/24561 |
| 2006/0123031 A1* | 6/2006 | Shin | G06F 16/9017 |
| 2010/0225506 A1 | 9/2010 | Chen et al. | |
| 2011/0246673 A1 | 10/2011 | Kishore et al. | |
| 2014/0229452 A1 | 8/2014 | Serita et al. | |
| 2015/0178214 A1 | 6/2015 | Alameldeen et al. | |
| 2015/0293817 A1* | 10/2015 | Subramanian | G06F 16/184 707/645 |
| 2016/0294410 A1 | 10/2016 | Bhaskar et al. | |

\* cited by examiner

DATA COMPRESSION WITH REDUNDANCY REMOVAL ACROSS BOUNDARIES OF COMPRESSION SEARCH ENGINES

FIELD

The field relates generally to data compression techniques.

BACKGROUND

Data often contains redundancy in the form of repeated patterns in a data frame, such as repeated bits, repeated bytes, repeated strings of bits and repeated strings of bytes. Compression represents frequently repeated data patterns in shorter binary codes thus reducing the total number of bits used to send out the entire data frame. For example, the letter "e" appears most frequently in an English context, so the letter "e" is represented by one dot in Morse code for transmission efficiency.

Data compression techniques aim to identify such repeated data patterns and then replace them with shorter strings. Many data compression techniques rely on one or more search engines to find such redundancy. There is a tradeoff between compression efficiency and the size of the search engines. Generally, larger search engines exhibit better compression efficiency, but also bring larger area and power consumption requirements for a hardware implementation, as well as longer latency in performing the search.

For a given search engine with a predefined boundary or a target engine with a smaller boundary size, a need exists for improved data compression techniques that remove redundancy across the boundary of compression search engines.

SUMMARY

In one embodiment, a method comprises splitting the data frame into a plurality of sub-chunks; comparing at least two of the plurality of sub-chunks to one another to remove at least one sub-chunk from the plurality of sub-chunks that substantially matches at least one other sub-chunk in the plurality of sub-chunks to generate a remaining plurality of sub-chunks; generating matching sub-chunk information for data reconstruction identifying the at least one removed sub-chunk and the corresponding substantially matched at least one other sub-chunk; grouping the remaining plurality of sub-chunks into sub-units; removing substantially repeated patterns within the sub-units to generate corresponding compressed sub-units; and combining the compressed sub-units with the matching sub-chunk information to generate a compressed data frame.

In one or more embodiments, the step of removing substantially repeated patterns comprises applying the plurality of sub-units to a compressor comprising compression search engines that identify the substantially repeated patterns in the plurality of sub-units to generate the compressed sub-units. The step of removing at least one sub-chunk from the plurality of sub-chunks removes redundancy from the plurality of sub-chunks across a boundary of a plurality of the compression search engines.

In some embodiments, the data frame is reconstructed by decompressing the compressed sub-units and restoring the at least one removed sub-chunk using the matching sub-chunk information.

In one illustrative embodiment, the data frame comprises one or more host pages compressed substantially simultaneously. The plurality of sub-chunks each comprise (i) one of the host pages, such that substantially duplicated host pages are removed, and/or (ii) a portion of one of the host pages, such that substantial duplication across a plurality of host pages is removed. The compressed data frame for a plurality of the host pages compressed substantially simultaneously comprises a host page address for each host page in the plurality of the host pages.

Other illustrative embodiments include, without limitation, apparatus, systems, methods and computer program products comprising processor-readable storage media.

DETAILED DESCRIPTION

Illustrative embodiments will be described herein with reference to exemplary solid state storage devices and associated storage media, controllers, and other processing devices. It is to be appreciated, however, that these and other embodiments are not restricted to the particular illustrative system and device configurations shown. Accordingly, the term "solid state storage device" as used herein are intended to be broadly construed, so as to encompass, for example, any storage device implementing the cross-boundary compression techniques described herein. Numerous other types of storage systems are also encompassed by the term "solid state storage device" as that term is broadly used herein.

In one or more embodiments, improved data compression techniques are provided that remove redundancy across the boundary of search engines. Among other benefits, the disclosed cross-boundary data compression techniques employ a plurality of smaller search engines to improve data processing throughput, while also further improving compression efficiency. In addition, in some embodiments, the interface of the disclosed cross-boundary data compression techniques can be the same as conventional compression implementations. Thus, the disclosed cross-boundary data compression techniques can be employed in any implementation where data compression is implemented, including, for example, storage devices and file archiving software.

Figure 1:
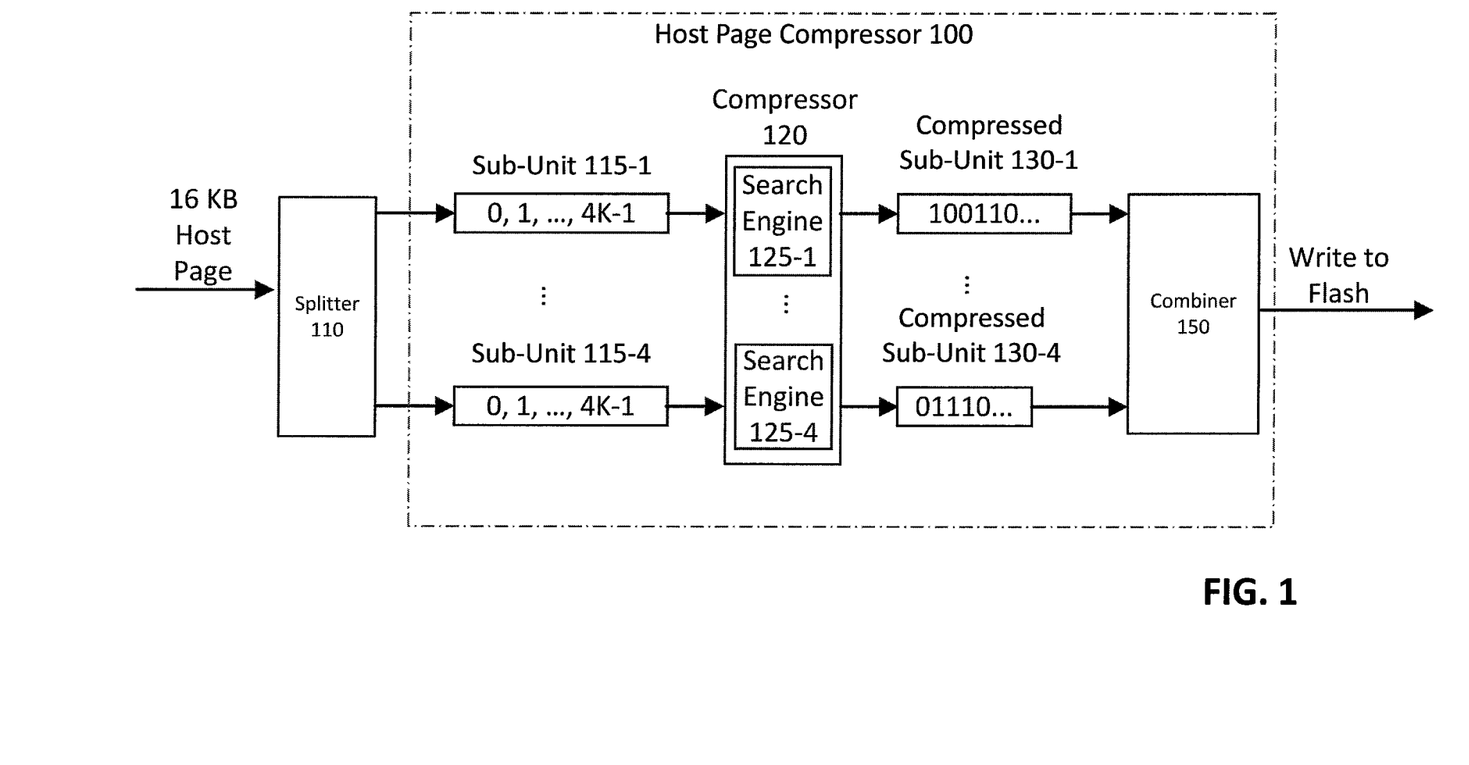
FIG. 1 is a block diagram of an information processing system implementing data compression of a data frame using fixed size search engines, in an illustrative embodiment of the present disclosure.

FIG. 1 is a block diagram illustrating an example host page compressor 100, according to one embodiment of the disclosure. The example host page compressor 100 may be implemented, for example, in a controller of a solid state storage device (SSD). As shown in FIG. 1, a Host Page, such as a 16 kibibyte (KB) Host Page, is applied to a splitter 110 that divides the Host Page into four sub-units (e.g., sub-pages) 115-1 through 115-4, in an exemplary embodiment. Each sub-unit 115 comprises 4 KB of the applied Host Page. Each sub-unit 115 is applied to a corresponding search engine 125-1 through 125-4 of a compressor 120. The compressor 120 may be implemented, for example, using the techniques described in J. Ziv and A. Lempel, "A Universal Algorithm for Sequential Data Compression," IEEE Trans. on Info. Theory, Vol. IT-23, No. 3, 337-343 (May 1977), incorporated by reference herein in its entirety.

After compression is performed by the compressor 120, to generate compressed sub-units 130-1 through 130-4, a combiner 150 combines the four compressed sub-units 130 together to write to the flash storage medium and mapped in the Flash Translation Layer (FTL), as one compressed Host Page.

Generally, the scope of the search is bounded by the size, or the boundary, of the search engines 125. Each search engine 125 removes substantially repeated patterns within a given sub-unit 115, such as repeated bits, repeated bytes, repeated strings of bits and repeated strings of bytes, to generate a corresponding compressed sub-unit 130. One or more aspects of the disclosure recognize that redundancy beyond the search boundary of the search engines 125 (e.g., a given sub-unit 115 searched by a search engine 125) cannot be compressed. In the exemplary embodiment of FIG. 1, the size of each search engine 125 is 2 KB.

The size of the Host Page in FIG. 1 is exemplary and can be varied in alternate embodiments (with corresponding changes to the number or size of the sub-units 115 and search engines 125), as would be apparent to a person of ordinary skill in the art. For example, one way to reduce the total number of Host Pages in a solid state storage device and thus the size of the FTL map is to increase the Host Page size, for example, from 16 KB to 64 KB, as the SSD capacity increases. In some cases, a larger Host Page size can be beneficial, especially if the host application always issues large input-output operations (IOs).

Since one Host Page is one unit to be mapped and stored into the physical flash media of the SSD, it is usually compressed as one unit of data. However, the compression unit size and the search engine size are not expected to grow to accommodate large Host Pages. The reason is to avoid increased cost in area, power and delay from the compressor hardware. As a result, one Host Page is often split using splitter 110 into multiple smaller sub-pages that fit a conventional compressor design.

Figure 2:
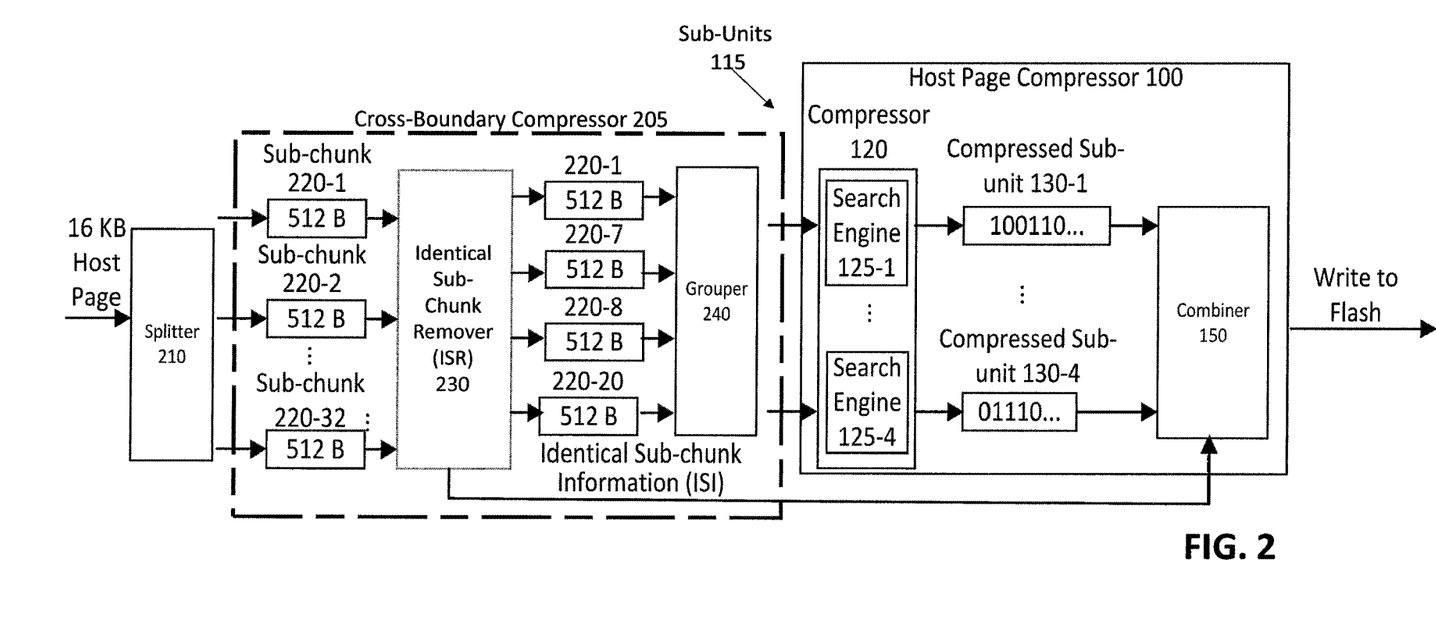
FIG. 2 is a block diagram illustrating data compression of a data frame with redundancy removal across boundaries of search engines, in one illustrative embodiment of the present disclosure.

FIG. 2 is a block diagram illustrating an example cross-boundary compressor (CBC) 205 that is applied in conjunction with the host page compressor 100 of FIG. 1, according to one embodiment of the disclosure. As shown in FIG. 2, a Host Page, such as a 16 kibibyte (KB) Host Page, is applied to a splitter 210 that divides the Host Page into a plurality of sub-chunks 220. In the exemplary embodiment of FIG. 2, the Host Page is divided into 32 sub-chunks 220-1 through 220-32, where each sub-chunk 220 comprises 512 bytes of the applied 16 KB Host Page. It has been found that splitting one Host Page into smaller sized sub-chunks provides a better chance of redundancy capture.

The sub-chunks 220 are applied to an identical sub-chunk remover (ISR) 230 within the CBC 205. Generally, the CBC 205 removes redundancy across the boundary of the search engines 125 of FIG. 1. In the embodiment of FIG. 2, the CBC 205 uses the same compressor interface as the embodiment of FIG. 1, so the CBC 205 takes in one 16 KB Host Page before the splitter 210.

The ISR 230 compares each of the plurality of sub-chunks 220 to one another to remove any duplicate sub-chunks 220 that substantially matches at least one other sub-chunk 220, as discussed further below in conjunction with FIG. 3. In this manner, the identical sub-chunks 220 are removed and only one unique copy appears at the output of the ISR 230. In the example of FIG. 2, after processing by the ISR 230, there are four unique sub-chunks 220 (sub-chunks 220-1, 220-7, 220-8 and 220-20) out of the original 32 sub-chunks 220 of the Host Page.

In addition, the ISR 230 generates identical sub-chunk information (ISI) that is applied to the combiner 150. Generally, the ISI provides matching sub-chunk information for data reconstruction identifying the removed sub-chunk(s) and the corresponding substantially matched sub-chunk, as discussed further below in conjunction with FIG. 4.

The remaining unique sub-chunks (sub-chunks 220-1, 220-7, 220-8 and 220-20 in FIG. 2) are applied to a grouper 240 that groups the unique sub-chunks 220 into sub-units 115, so that each sub-unit 115 can be handled by the Host Page compressor 100 of FIG. 1. The Host Page compressor 100 performs traditional compression using the search engines 125, as discussed above in conjunction with FIG. 1. The compressed sub-units 130-1 through 130-4 are combined by the combiner 150, together with the ISI information from the ISR 230, and written to the flash storage medium. The combiner 150 produces one compressed Host Page, in a similar manner as FIG. 1.

Figure 3:
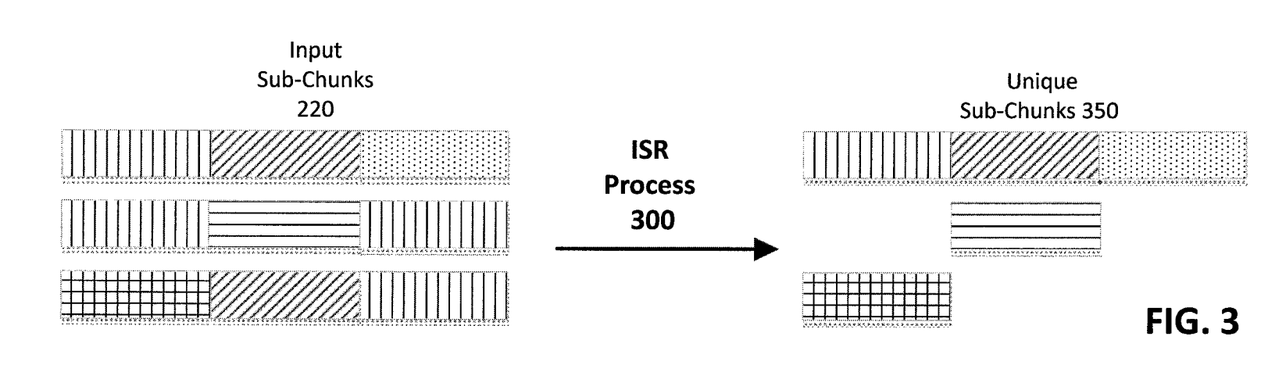
FIGS. 3 and 4 show an example of redundancy removal across boundaries of search engines during compression and original data reconstruction during decompression, respectively, in an illustrative embodiment of the present disclosure.

FIG. 3 illustrates an example identical sub-chunk removal process 300 that may be implemented by the ISR 230 of FIG. 2, in accordance with one embodiment of the disclosure. As shown in FIG. 3, the input sub-chunks 220 are applied to the ISR process 300. Each row of the input sub-chunks 220 represents a "raw" data frame of 4 KB which contains smaller data patterns (same patterns have the same hash pattern). On the 4 KB level, the three frames in the input sub-chunks 220 are different, or no redundancy exists. One or more aspects of the present disclosure, however, recognize smaller sized chunks will exhibit repetitions and/or redundancy, e.g., the pattern associated with the top, left cell of the input sub-chunks 220 repeats three times and the pattern associated with the middle cell of the top row of input sub-chunks 220 repeats two times. The duplicate sub-chunks 220 can be removed by the ISR process 300, such that only unique sub-chunks 350 remain.

It is again noted that the redundancy detected by the ISR process 300 cannot be identified by the search engines 125 in the Host Page compressor 100 of FIG. 1, as the repeated patterns are not within the 2 KB boundary of the search engines 125. The redundancy detected by the ISR process 300 is referred to herein as "cross-boundary redundancy."

It is noted that a smaller sub-chunk size will require more sub-chunks given the same Host Page size, and more bits to represent the Identical Sub-Chunk Information (ISI) of FIG. 2 that is used to reconstruct the original data during decompression.

Figure 4:
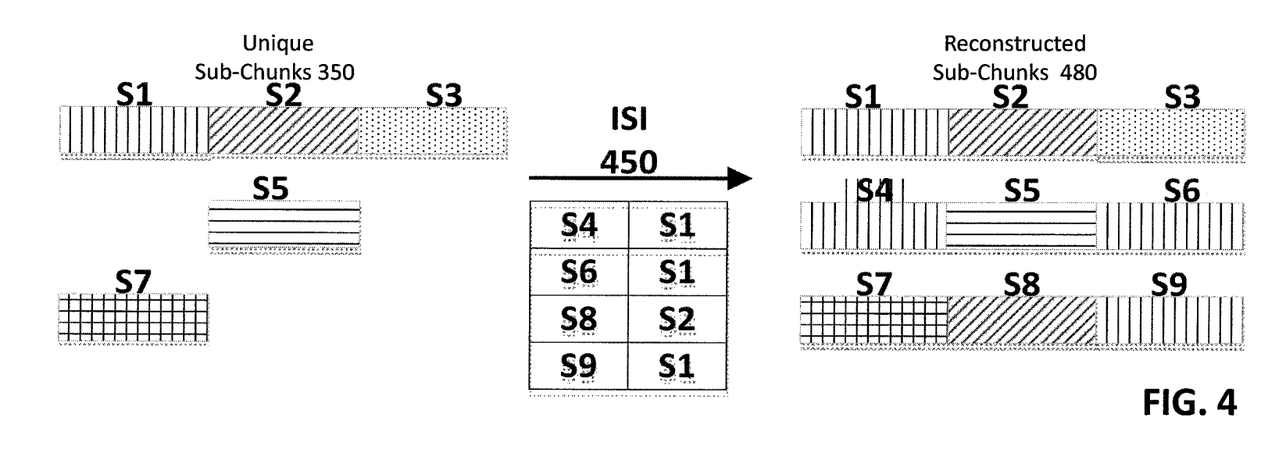

FIG. 4 illustrates a sample table 450 of the Identical Sub-Chunk Information (ISI) of FIG. 2, according to an embodiment of the disclosure. As noted above, the ISI information provides matching sub-chunk information for data reconstruction identifying the removed sub-chunk(s) and the corresponding substantially matched sub-chunk. For example, as shown in FIG. 4, for the exemplary unique sub-chunks 350 generated by the ISR process 300 of FIG. 3, the ISI table 450 indicates that: sub-chunk S4 has been removed, as it substantially matches sub-chunk S1; sub-chunk S6 has been removed, as it substantially matches sub-chunk S1; sub-chunk S8 has been removed, as it substantially matches sub-chunk S2; and sub-chunk S9 has been removed, as it substantially matches sub-chunk S1. The ISI table 450 is used during decompression to generate the reconstructed sub-chunks 480 (a reconstructed version of the input sub-chunks 220 shown in FIG. 3).

The ISI table 450 contains all of the information needed for the reconstruction: the size of the table 450 indicates how many sub-chunks are removed, and each entry in the table 450 indicates which unique sub-chunk to copy to restore the removed sub-chunks. For example, the entry (S4, S1) means that sub-chunk S4 should be copied from sub-chunk S1. Since there are nine sub-chunks in total in the input sub-chunks 220 shown in FIG. 3, four bits are used to represent each sub-chunk. Additional sub-chunks result in additional bits of compressed data, as would be apparent to a person of ordinary skill in the art.

The ISI information in the ISI table 450 of FIG. 4 can optionally be stored as a lookup table inside the compressed data that is written to the flash memory device.

In one or more embodiments, the decompression process will first generate decompressed unique data corresponding to the unique sub-chunks 350 of FIG. 3, and then reconstruct the full original data by copying removed sub-chunk from the matching sub-chunk indicated in the ISI table 450.

Figure 5:
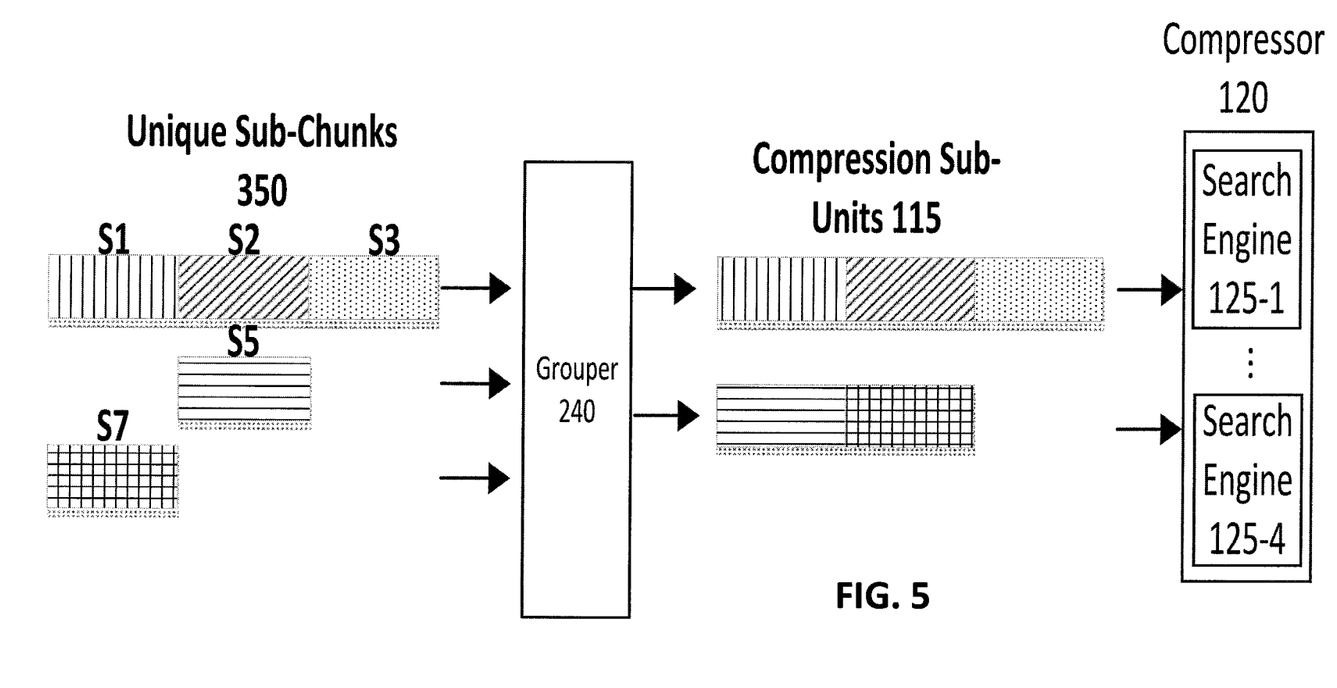
FIG. 5 shows an example of flexible grouping of unique data sub-chunks for improved compression efficiency and throughput tradeoff, in one illustrative embodiment of the present disclosure.

FIG. 5 illustrates an exemplary compression of the exemplary unique sub-chunks 350 generated by the ISR process 300 of FIG. 3, according to flexible grouping embodiments of the disclosure. As shown in FIG. 5, the exemplary unique sub-chunks 350 are applied to the grouper 240 of FIG. 2, which generates the compression sub-units 115, as discussed above in conjunction with FIGS. 1 and 2. The compression sub-units 115 are then applied to respective search engines 125 of the compressor 120, as discussed above.

In the embodiment of FIG. 2, there are four unique sub-chunks (220-1, 220-7, 220-8, and 220-20) after the ISR 230 with a total size of 2 KB. The four unique sub-chunks could fit in the search boundary of one search engine 125 of the compressor 120. In one or more embodiments, the grouper 240 in FIG. 2 forms two compression sub-units 115 having a size of 1 KB each, that are sent to the compressor 120, to achieve a higher throughput. The compression sub-units 115 having a size of 1 KB can be compressed in parallel and thereby cut the delay in half compared to one sub-unit 115 having a size of 2 KB, given multiple compression search engines 125 in the compressor 120.

In various flexible grouping embodiments, the sub-chunks can also be grouped into fewer and larger sub-units so that the search engine can get more repeated patterns and a better compression efficiency.

In the embodiment of FIG. 5, there are five unique sub-chunks (S1-S3, S5 and S7) after the ISR 230. The grouper 240 groups the last two sub-chunks S5 and S7 together to produce a better compression efficiency, instead of being compressed separately.

The sub-chunks can also be rearranged and/or reordered if better compression efficiency can be achieved. The reordering information should be included in the compression data together with the ISI information for original data reconstruction. How to group and/or reorder the unique sub-chunks 350 to sub-units 115 depends on the data pattern and/or performance requirement.

Figure 6:
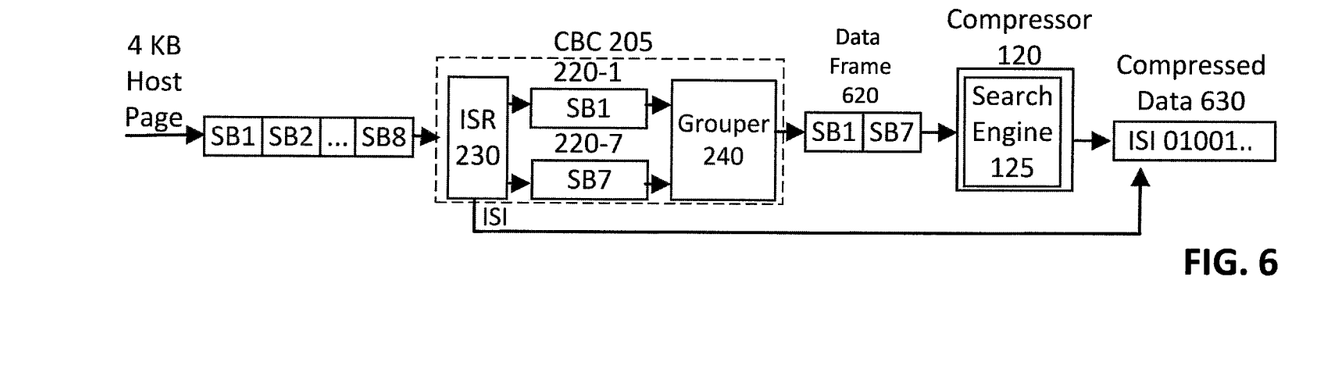
FIG. 6 is a block diagram of cross-boundary compression for one host page, in an illustrative embodiment of the present disclosure.

FIG. 6 illustrates an exemplary compression of a Host Page, according to a small Host Page compression embodiment of the disclosure. In an exemplary small Host Page compression embodiment, it is assumed that each Host Page can be processed by one search engine, such as a 4 KB Host Page. As shown in FIG. 6, assume that one 4 KB Host Page is comprised of sub-chunks SB1 through SB8, where each sub-chunk has a size of 512 bytes.

In a cross-boundary compression implementation, the sub-chunks SB1 through SB8 are applied to the CBC 205 (as discussed above in conjunction with FIG. 2). Assume that the unique sub-chunks 220 are SB1 (220-1) and SB7 (220-7), and the additional six sub-chunks are duplicates of the two unique sub-chunks SB1 and SB7. The grouper 240 groups the two unique sub-chunks SB1 and SB7 into a 1 KB data frame 620 comprised of SB1 and SB7. The data frame 620 is applied to the compressor 120, as opposed to the original 4 KB Host Page. The compressed data 630 will include the ISI information generated by the ISR 230, and will be different than the compressed data that would have resulted if the full 4 KB Host Page was applied to the compressor 120.

Note that in the case of FIG. 6, the ISI information generated by the ISR 230 should be stored together with the ultimate compressed data. Conversely, to recover the original data from such compressed data, the ISI information is first extracted from the compressed data, and then the remaining portions are decompressed using the original decompressor to obtain the 1 KB data frame 620 (SB1 and SB7). Finally, the ISI information is used to reconstruct the additional 6 duplicated sub-chunks to obtain the entire 4 KB Host Page, following the decompression techniques described above.

It has been found that the compression shown in FIG. 6 exhibits a higher compression efficiency, relative to compression of the full 4 KB Host Page. The reason is that the size of the search engine 125, or the "boundary" of the compressor 120 can be smaller than a size of one Host Page. As discussed above, even with a 4 KB Host Page, the boundary can be 2 KB. Thus, if a given sub-chunk is a duplicate of another sub-chunk, then the conventional compression of the full 4 KB Host Page will fail to capture this redundancy (since, for example, sub-chunk SB8 is located 3584 bytes away from sub-chunk SB1, which is beyond the 2 KB boundary). The disclosed cross-boundary compression techniques manage to detect and remove this redundancy, and thereby improve compression.

Figure 7:
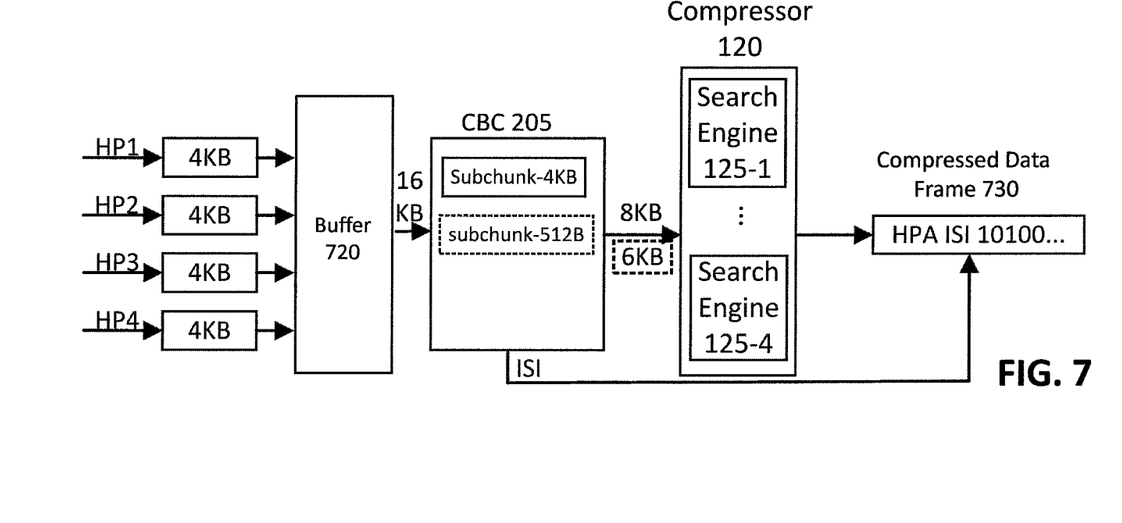
FIG. 7 is a block diagram of cross-boundary compression for multiple host pages compressed together, and capable of data deduplication as well as redundancy removal both inside and outside host pages, in one illustrative embodiment of the present disclosure.

FIG. 7 illustrates an exemplary compression of a plurality of Host Pages, according to a data deduplication embodiment of the disclosure. A number of SSD controllers support compression of multiple Host Pages into one compressed data frame 730. For example, if one Host Page has a size of 4 KB, but four Host Pages can be compressed together, then the compressor sees a total of 16 KB data.

In the example of FIG. 7, four Host Pages HP1 through HP4 (each having an exemplary size of 4 KB) are compressed together, hence the compressor 120 sees a total of 16 KB data. The four Host Pages HP1 through HP4 having a total size of 16 KB are first applied to an optional buffer 720 so that data can be accumulated until a desired amount of CBC data, e.g., 16 KB, is reached. The size of the buffer 720 and size of the sub-chunks in the CBC can be adjusted according to target performance requirements, such as compression efficiency, delay, and a memory capacity of the buffer 720. In the example of FIG. 7, the sub-chunks can be selectively set to 4 KB or 512 bytes.

The 16 KB data is applied to the CBC 205 of FIG. 2. The CBC 205 removes duplicate sub-chunks and generates the ISI information, in the manner described above. The CBC 205 described above is extended for use in the embodiment of FIG. 7 to perform deduplication of duplicated Host Pages by setting the sub-chunk size to be, for example, 4 KB (or 512 bytes). In this manner, the CBC 205 will detect redundancy on the 4 KB level, i.e., duplicated sub-chunks (on the order of Host Pages) will be detected by the CBC 205 and removed. For example, if there are two duplicate 4 KB Host Pages in the input data of FIG. 7, the data to be compressed will be reduced by the CBC 205 to only 8 KB before being sent to the compressor 120. ISI information is added in the final compressed data frame 730, in the manner described above.

The unique Host Pages (e.g., 8 KB of data) are applied as one or more sub-units to the search engines 125 of the compressor 120, which generates compressed versions of the unique Host Pages. The combiner (not shown in FIG. 7) then combines the compressed unique Host Pages into a compressed data frame 730.

Since one compressed data frame 730 should be decompressed together to recover original content, the compressed data frame 730 comprises Host Page Address (HPA) information for each compressed Host Page HP in order to distinguish data for different Host Pages.

Without the CBC 205 in the embodiment of FIG. 7, compression capability would be limited by the boundary of the search engines 125 in the compressor 120, say, 2 KB. As a result, redundancy in the Host Page level is beyond the scope of the compressor 120, and cannot be detected or removed. For example, if Host Pages HP1 and HP4 contain the same data, the compressed Host Pages HP1 and HP4 would also be the same, which would lead to two copies of the same data piece being stored in the flash memory (if the CBC 205 was not employed). This type of redundancy is referred to as duplication, which could be duplicated Host Pages in controllers, or even duplicated files of much larger size. The algorithm that removes such redundancy is in turn referred to as data deduplication (or dedup for short).

If the sub-chunk size in the CBC 205 of FIG. 7 was set to a smaller size than one Host Page, such as 512 bytes, then the CBC 205 conducts data deduplication using a finer scale, and is able to remove redundancy both inside one Host Page and across different Host Pages. The dashed box showing "sub-chunk-512B" inside the CBC 205 of FIG. 7 illustrates this idea, which leads to only 6 KB of data to be processed by the compressor 120.

Figure 8:
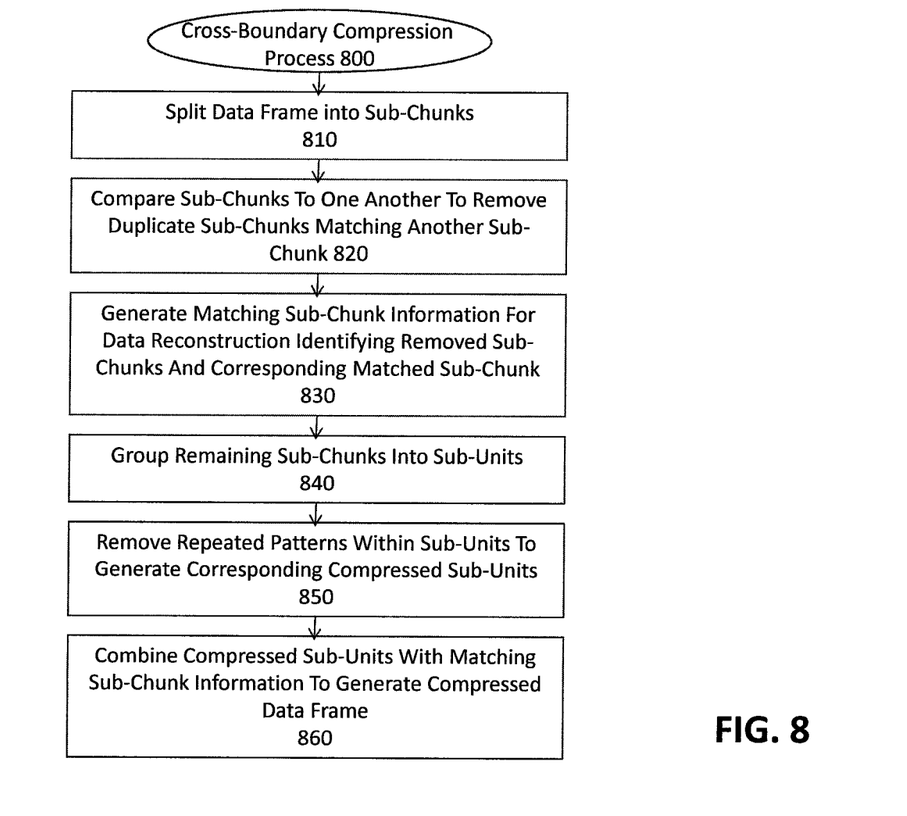
FIG. 8 is a flow diagram showing an exemplary implementation of a cross-boundary compression process, according to one embodiment of the disclosure.

If the compression of multiple Host Pages as one compression unit is not supported in an SSD controller, the Flash Translation Layer (FTL), which keeps record of which Host Page is written to which location in the flash memory, is optionally modified so that multiple Host Pages can be mapped into one same flash memory location. FIG. 8 is a flow chart illustrating an exemplary implementation of a cross-boundary compression process 800, according to one embodiment of the disclosure. As shown in FIG. 1, an input data frame is initially split into sub-chunks during step 810. The sub-chunks are then compared to one another during step 820 to remove duplicate sub-chunks matching another sub-chunk (such that only one copy remains). Different methods may be employed to determine whether two sub-chunks match each other, such as comparison of two values generated by passing each sub-chunk through some parity check or Hash function, or byte-by-byte comparison. Matching sub-chunk information is generated during step 830 for data reconstruction that identifies the removed sub-chunks and the corresponding matched sub-chunk.

The remaining sub-chunks are grouped into sub-units during step 840. Repeated patterns within the sub-units are removed during step 850 to generate corresponding compressed sub-units. Finally, the compressed sub-units are combined with the matching sub-chunk information during step 860 to generate a compressed data frame.

The particular processing operations and other system functionality described in conjunction with the flow diagram of FIG. 8 are presented by way of illustrative example only, and should not be construed as limiting the scope of the disclosure in any way. Alternative embodiments can use other types of processing operations involving cross-boundary compression. For example, the ordering of the process steps may be varied in other embodiments, or certain steps may be performed at least in part concurrently with one another rather than serially. Also, one or more of the process steps may be repeated periodically, or multiple instances of the process can be performed in parallel with one another in order to implement a plurality of different cross-boundary compression and deduplication.

Functionality such as that described in conjunction with the flow diagram of FIG. 8 can be implemented at least in part in the form of one or more software programs stored in memory and executed by a processor of a processing device such as a computer or server. As will be described below, a memory or other storage device having executable program code of one or more software programs embodied therein is an example of what is more generally referred to herein as a "processor-readable storage medium."

Figure 9:
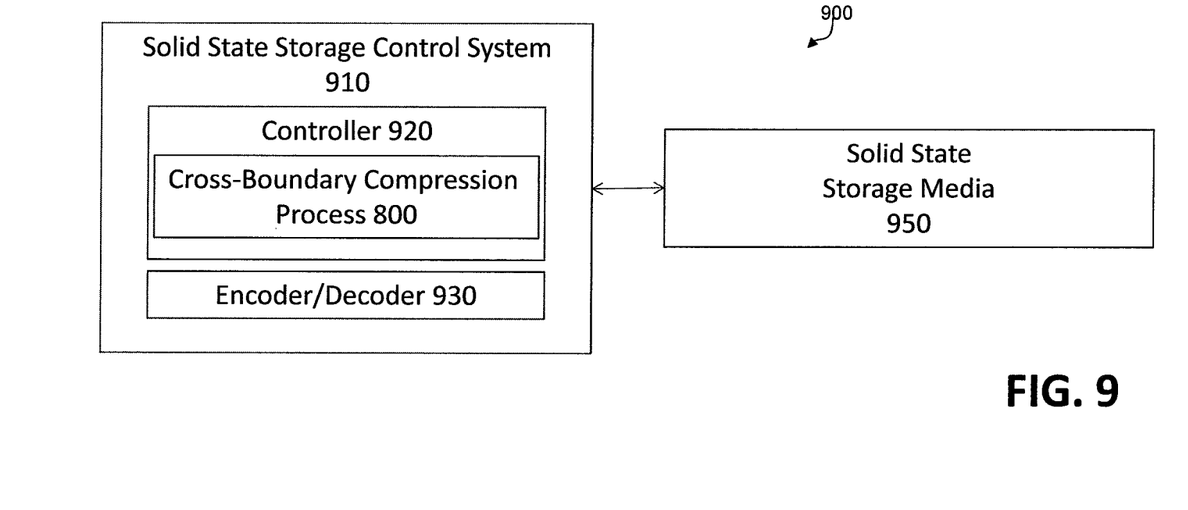
FIG. 9 is a schematic block diagram of a solid state storage system, in an illustrative embodiment of the present disclosure.

FIG. 9 is a schematic block diagram of an illustrative solid state storage system 900. As shown in FIG. 9, the illustrative solid state memory system 900 comprises a solid state storage control system 910 and a solid state storage media 950. The exemplary solid state storage control system 910 comprises a controller 920 and an encoder/decoder block 930. In an alternative embodiment, the encoder/decoder block 930 may be implemented inside the controller 920.

As shown in FIG. 9, the controller 920 comprises a cross-boundary compression process 800, discussed above in conjunction with FIG. 8, to implement the cross-boundary compression techniques described herein. The encoder/decoder block 930 may be implemented, for example, using well-known commercially available techniques and/or products. The encoder within the encoder/decoder block 930 may implement, for example, error correction encoding, such as a low-density parity-check (LDPC) encoding. The decoder within the encoder/decoder block 930 may be embodied, for example, as a hard decision decoder, such as a hard decision low-density parity-check (HLDPC) decoder.

The solid state storage media 950 comprises a memory array, such as a single-level or multi-level cell flash memory, a NAND flash memory, a phase-change memory (PCM), a magneto-resistive random access memory (MRAM), a nano RAM (NRAM), a NOR flash memory, a dynamic RAM (DRAM) or another non-volatile memory (NVM). While the invention is illustrated primarily in the context of a solid state storage device (SSD), the disclosed cross-boundary compression techniques can be applied in hard disk drives (HDD) and other storage devices, as would be apparent to a person of ordinary skill in the art based on the present disclosure.

It should be understood that the particular cross-boundary compression arrangements illustrated in FIGS. 1 through 9 are presented by way of illustrative example only, and should not be construed as limiting in any way. Numerous alternative configurations of system and device elements and associated processing operations can be used in other embodiments.

Illustrative embodiments disclosed herein can provide a number of significant advantages relative to conventional arrangements.

For example, one or more embodiments provide significantly improved redundancy detection and by splitting one data frame to multiple smaller sub-chunks and redundant sub-chunks can be removed beyond the boundary of one compression search engine. As a result, compression efficiency is improved and searching latency is reduced.

In some embodiments, where multiple Host Pages are compressed and/or mapped together in SSDs, duplicated Host Pages are removed before compression to achieve data deduplication (e.g., redundancy removal at the Host Page level). When such deduplication techniques are combined with smaller sub-chunks, redundancy is removed both inside and across Host Pages.

It is to be appreciated that the particular advantages described above and elsewhere herein are associated with particular illustrative embodiments and need not be present in other embodiments. Also, the particular types of cross-boundary compression features and functionality as illustrated in the drawings and described above are exemplary only, and numerous other arrangements may be used in other embodiments.

As mentioned previously, at least portions of the disclosed cross-boundary compression system may be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

Some illustrative embodiments of a processing platform that may be used to implement at least a portion of an information processing system comprises cloud infrastructure including virtual machines. The cloud infrastructure further comprises sets of applications running on respective ones of the virtual machines. These and other types of cloud infrastructure can be used to provide what is also referred to herein as a multi-tenant environment. One or more system components such as cross-boundary compressor 205 and/or compressor 120, or portions thereof, are illustratively implemented for use by tenants of such a multi-tenant environment.

The disclosed cross-boundary compression arrangements may be implemented using one or more processing platforms. One or more of the processing modules or other components may therefore each run on a computer, storage device or other processing platform element. A given such element may be viewed as an example of what is more generally referred to herein as a "processing device."

Figure 10:
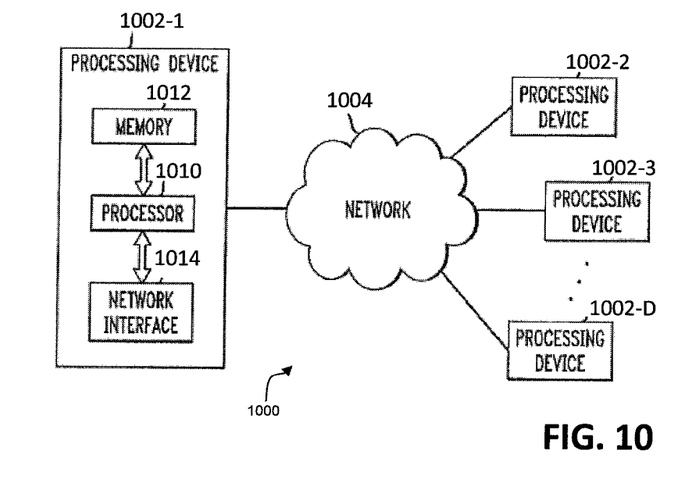
FIG. 10 illustrates a processing platform that may be used to implement at least a portion of one or more embodiments of the disclosure.

Referring now to FIG. 10, one possible processing platform that may be used to implement at least a portion of one or more embodiments of the disclosure is shown. The processing platform 1000 in this embodiment comprises at least a portion of the given system and includes at least one processing device(s), denoted 1002-1, 1002-2, 1002-3, . . . 1002-D, which communicate with one another over a network 1004. The network 1004 may comprise any type of network, such as the Internet, a wireless area network (WAN), a local area network (LAN), a satellite network, a telephone or cable network, a cellular network, a wireless network such as WiFi or WiMAX, or various portions or combinations of these and other types of networks.

The processing device 1002-1 in the processing platform 1000 comprises a processor 1010 coupled to a memory 1012. The processor 1010 may comprise a microprocessor, a microcontroller, an application specific integrated circuit (ASIC), a field programmable gate array (FPGA) or other type of processing circuitry, as well as portions or combinations of such circuitry elements. The memory 1012 may comprise random access memory (RAM), read only memory (ROM) or other types of memory, in any combination. The memory 1012 and other memories disclosed herein should be viewed as illustrative examples of what are more generally referred to as "processor-readable storage media" storing executable program code of one or more software programs.

Also included in the processing device 1002-1 is network interface circuitry 1014, which is used to interface the processing device with the network 1004 and other system components, and may comprise conventional transceivers.

The other processing devices 1002, if any, of the processing platform 1000 are assumed to be configured in a manner similar to that shown for processing device 1002-1 in the figure.

Again, the particular processing platform 1000 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 10, or each such element may be implemented on a separate processing platform.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Again, the particular processing platform 1000 shown in FIG. 10 is presented by way of example only, and the cross-boundary compression system may include additional or alternative processing platforms, as well as numerous distinct processing platforms in any combination, with each such platform comprising one or more computers, servers, storage devices or other processing devices.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the cross-boundary compression techniques system. Such components can communicate with other elements of the cross-boundary compression system over any type of network or other communication media.

As indicated previously, components of an information processing system as disclosed herein can be implemented at least in part in the form of one or more software programs stored in memory and executed by a processor of a processing device. For example, at least portions of the functionality of the cross-boundary compression process 800 of FIG. 8 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems and cross-boundary compression systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A method for compressing a data frame, comprising:
   splitting the data frame into a plurality of sub-chunks;
   comparing at least two of the plurality of sub-chunks to one another to remove at least one sub-chunk from the plurality of sub-chunks that substantially matches at least one other sub-chunk in the plurality of sub-chunks to generate a remaining plurality of sub-chunks;
   generating matching sub-chunk information for data reconstruction identifying the at least one removed sub-chunk and the corresponding substantially matched at least one other sub-chunk;
   grouping the remaining plurality of sub-chunks into one or more sub-units;
   removing one or more substantially repeated patterns within the one or more sub-units to generate a corresponding one or more compressed sub-units; and
   combining the one or more compressed sub-units with the matching sub-chunk information to generate a compressed data frame.

2. The method of claim 1, wherein the substantially repeated patterns comprise one or more of repeated bits, repeated bytes, repeated strings of bits and repeated strings of bytes.

3. The method of claim 1, wherein the step of removing one or more substantially repeated patterns comprises applying the plurality of sub-units to a compressor comprising one or more compression search engines that identify the substantially repeated patterns in the plurality of sub-units to generate the one or more compressed sub-units.

4. The method of claim 3, wherein the step of removing at least one sub-chunk from the plurality of sub-chunks removes redundancy from the plurality of sub-chunks across a boundary of a plurality of the one or more compression search engines.

5. The method of claim 1, wherein the step of grouping the remaining plurality of sub-chunks into the plurality of sub-units groups substantially unique sub-chunks into a number of sub-units to increase one or more of a compression throughput and a compression efficiency.

6. The method of claim 1, further comprising the step of reconstructing the data frame by decompressing the one or more compressed sub-units and restoring the at least one removed sub-chunk using the matching sub-chunk information.

7. The method of claim 1, wherein the data frame comprises one or more host pages compressed substantially simultaneously, where one host page is one logic data unit addressable by a file system in one or more of a computer, a server, and a storage controller.

8. The method of claim 7, wherein the plurality of sub-chunks each comprise one or more of (i) one of the host pages, such that substantially duplicated host pages are removed, and (ii) a portion of one of the host pages, such that substantial duplication across a plurality of host pages is removed.

9. The method of claim 7, wherein the compressed data frame for a plurality of the host pages compressed substantially simultaneously comprises a host page address for each host page in the plurality of the host pages.

10. The method of claim 9, wherein the plurality of host pages compressed substantially simultaneously is mapped to one or more physical page addresses by the file system, where one physical page comprises an area in a storage space.

11. The method of claim 7, further comprising the step of accumulating the data frame in a buffer before the step of splitting the data frame into a plurality of sub-chunks.

12. The method of claim 11, wherein a number of the host pages and a size of the sub-chunks are adjusted based on one or more of a target compression efficiency, a target delay, and a memory capacity of the buffer.

13. A computer program product comprising a non-transitory processor-readable storage medium having stored therein program code of one or more software programs, wherein the program code when executed by at least one processing platform causes the at least one processing platform to implement the following steps:
   splitting the data frame into a plurality of sub-chunks;
   comparing at least two of the plurality of sub-chunks to one another to remove at least one sub-chunk from the plurality of sub-chunks that substantially matches at least one other sub-chunk in the plurality of sub-chunks to generate a remaining plurality of sub-chunks;
   generating matching sub-chunk information for data reconstruction identifying the at least one removed sub-chunk and the corresponding substantially matched at least one other sub-chunk;
   grouping the remaining plurality of sub-chunks into one or more sub-units;
   removing one or more substantially repeated patterns within the one or more sub-units to generate a corresponding one or more compressed sub-units; and
   combining the one or more compressed sub-units with the matching sub-chunk information to generate a compressed data frame.

14. An apparatus, comprising:
a memory; and
at least one processing device, coupled to the memory, operative to implement the following steps:
splitting the data frame into a plurality of sub-chunks;
comparing at least two of the plurality of sub-chunks to one another to remove at least one sub-chunk from the plurality of sub-chunks that substantially matches at least one other sub-chunk in the plurality of sub-chunks to generate a remaining plurality of sub-chunks;
generating matching sub-chunk information for data reconstruction identifying the at least one removed sub-chunk and the corresponding substantially matched at least one other sub-chunk;
grouping the remaining plurality of sub-chunks into one or more sub-units;
removing one or more substantially repeated patterns within the one or more sub-units to generate a corresponding one or more compressed sub-units; and
combining the one or more compressed sub-units with the matching sub-chunk information to generate a compressed data frame.

15. The apparatus of claim 14, wherein the step of removing one or more substantially repeated patterns comprises applying the plurality of sub-units to a compressor comprising one or more compression search engines that identify the substantially repeated patterns in the plurality of sub-units to generate the one or more compressed sub-units.

16. The apparatus of claim 15, wherein the step of removing at least one sub-chunk from the plurality of sub-chunks removes redundancy from the plurality of sub-chunks across a boundary of a plurality of the one or more compression search engines.

17. The apparatus of claim 14, further comprising the step of reconstructing the data frame by decompressing the one or more compressed sub-units and restoring the at least one removed sub-chunk using the matching sub-chunk information.

18. The apparatus of claim 14, wherein the data frame comprises one or more host pages compressed substantially simultaneously, where one host page is one logic data unit addressable by a file system in one or more of a computer, a server, and a storage controller.

19. The apparatus of claim 18, wherein the plurality of sub-chunks each comprise one or more of (i) one of the host pages, such that substantially duplicated host pages are removed, and (ii) a portion of one of the host pages, such that substantial duplication across a plurality of host pages is removed.

20. The apparatus of claim 18, wherein the compressed data frame for a plurality of the host pages compressed substantially simultaneously comprises a host page address for each host page in the plurality of the host pages.

* * * * *